(12) United States Patent
Wang et al.

(10) Patent No.: US 10,670,719 B2
(45) Date of Patent: Jun. 2, 2020

(54) LIGHT DETECTION SYSTEM HAVING MULTIPLE LENS-RECEIVER UNITS

(71) Applicant: DiDi Research America, LLC, Mountain View, CA (US)

(72) Inventors: Youmin Wang, Berkeley, CA (US); Chao Wang, Milpitas, CA (US); Yue Lu, Los Gatos, CA (US); Lingkai Kong, Palo Alto, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/059,028

(22) Filed: Aug. 8, 2018

(65) Prior Publication Data

US 2019/0369242 A1    Dec. 5, 2019

Related U.S. Application Data

(60) Provisional application No. 62/678,974, filed on May 31, 2018.

(51) Int. Cl.
*G01S 17/04* (2020.01)
*G02B 27/09* (2006.01)
(Continued)

(52) U.S. Cl.
CPC .............. *G01S 17/04* (2020.01); *G02B 7/025* (2013.01); *G02B 27/0961* (2013.01); *H01L 25/167* (2013.01)

(58) Field of Classification Search
CPC .............. G01C 3/08; G01P 3/36; G01B 11/14
See application file for complete search history.

(56) References Cited

U.S. PATENT DOCUMENTS 9,069,061 B1    6/2015  Harwit
2006/0227317 A1*  10/2006 Henderson ........... G01B 11/026
356/28
(Continued)

FOREIGN PATENT DOCUMENTS

CN    106970393 A    7/2017
CN    107462898 A    12/2017
(Continued)

OTHER PUBLICATIONS

International Search Report issued in corresponding International Application No. PCT/US2018/067567, dated Apr. 24, 2019, 4 pages.
(Continued)

*Primary Examiner* — Luke D Ratcliffe
(74) *Attorney, Agent, or Firm* — Bayes PLLC

(57) ABSTRACT

Embodiments of the disclosure provide an apparatus, system, and method for detecting light returned from an object. The apparatus includes a plurality of lenses. Each lens is configured to collect light from a respective direction. The apparatus also includes a plurality of receivers. At least one of the plurality of receivers corresponds to one of the plurality of lenses and is configured to convert the light collected by the corresponding lens into an electrical signal. The apparatus further includes a multiplexer operatively coupled to the plurality of receivers and configured to select at least one of the plurality of receivers to output the corresponding electrical signal. The selected at least one receiver corresponds to the lens collecting the light returned from the object.

16 Claims, 6 Drawing Sheets

(51) Int. Cl.
      *G02B 7/02*       (2006.01)
      *H01L 25/16*     (2006.01)

(56) References Cited

U.S. PATENT DOCUMENTS

| | | | |
|---|---|---|---|
| 2008/0273190 A1* | 11/2008 | Smith | F41G 3/14 |
| | | | 356/4.01 |
| 2011/0194099 A1 | 8/2011 | Kamiyama | |
| 2014/0350836 A1* | 11/2014 | Stettner | G01S 7/481 |
| | | | 701/301 |
| 2015/0177383 A1* | 6/2015 | Ruff | G01S 17/89 |
| | | | 356/4.01 |
| 2015/0260843 A1* | 9/2015 | Lewis | G02B 26/108 |
| | | | 356/5.01 |
| 2018/0100929 A1 | 4/2018 | O'Keeffe | |
| 2018/0143324 A1 | 5/2018 | Keilaf et al. | |

FOREIGN PATENT DOCUMENTS

| | | |
|---|---|---|
| DE | 102016002441 B3 | 7/2017 |
| JP | H0815434 A | 1/1996 |

OTHER PUBLICATIONS

Written Opinion of the International Searching Authority issued in corresponding International Application No. PCT/US2018/067567, dated Apr. 24, 2019, 5 pages.

\* cited by examiner

LIGHT DETECTION SYSTEM HAVING MULTIPLE LENS-RECEIVER UNITS

CROSS REFERENCE TO RELATED APPLICATION

The present application is based on and claims the benefits of priority to U.S. Provisional Application No. 62/678,974, filed May 31, 2018, which is incorporated herein by reference in its entirety.

TECHNICAL FIELD

The present disclosure relates to a light detection system, and more particularly to, a light detection system having multiple lens-receiver units and methods using the same.

BACKGROUND

Light detection systems have been widely used in autonomous driving and producing high-definition maps. For example, Light Detection and Ranging (LiDAR) systems measure distance to a target by illuminating the target with pulsed laser light and measuring the reflected pulses with a sensor. Differences in laser return times and wavelengths can then be used to make digital three-dimensional (3-D) representations of the target. The laser light used for LiDAR scan may be ultraviolet, visible, or near infrared. Because a narrow laser beam as the incident light from the scanner can map physical features with very high resolution, a LiDAR system is particularly suitable for high-definition map surveys.

However, a wide scan angle is typically used by LiDAR to capture the scene. Accordingly, the detector of a typical LiDAR system usually includes a single lens-receiver unit having a wide field of view (FOV) to ensure that the returned light can be well captured. In that case, the optical gain, i.e. the amount of light the system can admit, is limited, thereby limiting the signal-to-noise ratio (SNR) and system performance. Moreover, traditional detectors allow more interferences to be received with a single wide-angle lens, which can further reduce SNR and the scan resolution.

Embodiments of the disclosure address the above problems by an improved system for light detection having multiple lens-receiver units.

SUMMARY

Embodiments of the disclosure provide an apparatus for detecting light returned from an object in a LiDAR system. The apparatus includes a plurality of lenses. Each lens is configured to collect light from a respective direction. The apparatus also includes a plurality of receivers. At least one of the plurality of receivers corresponds to one of the plurality of lenses and is configured to convert the light collected by the corresponding lens into an electrical signal. The apparatus further includes a multiplexer operatively coupled to the plurality of receivers and configured to select at least one of the plurality of receivers to output the corresponding electrical signal. The selected at least one receiver corresponds to the lens collecting the light returned from the object.

Embodiments of the disclosure also provide a system for detecting light returned from an object. The system includes a scanner configured to emit light to the object in a first direction. The system also includes a detector configured to detect the light returned from the object in a second direction. The detector includes a plurality of lenses. Each lens is configured to collect light from a respective direction. The detector also includes a plurality of receivers. At least one of the plurality of receivers corresponds to one of the plurality of lenses and is configured to convert the light collected by the corresponding lens into an electrical signal. The detector further includes a multiplexer operatively coupled to the plurality of receivers and configured to select at least one of the plurality of receivers to output the corresponding electrical signal. The system further includes a controller operatively coupled to the scanner and detector and configured to control the scanner to emit the light in the first direction, and control the multiplexer to select the at least one receiver based on the first direction.

Embodiments of the disclosure further provide a method for detecting light returned from an object. The method includes emitting light to the object in a first direction, and collecting, by one of a plurality of lenses, the light returned from the object in a second direction. The method also includes selecting at least one of a plurality of receivers corresponding to the lens based on the first direction. The method further includes converting, by the selected at least one receiver, the collected light into an electrical signal, and outputting the electrical signal.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
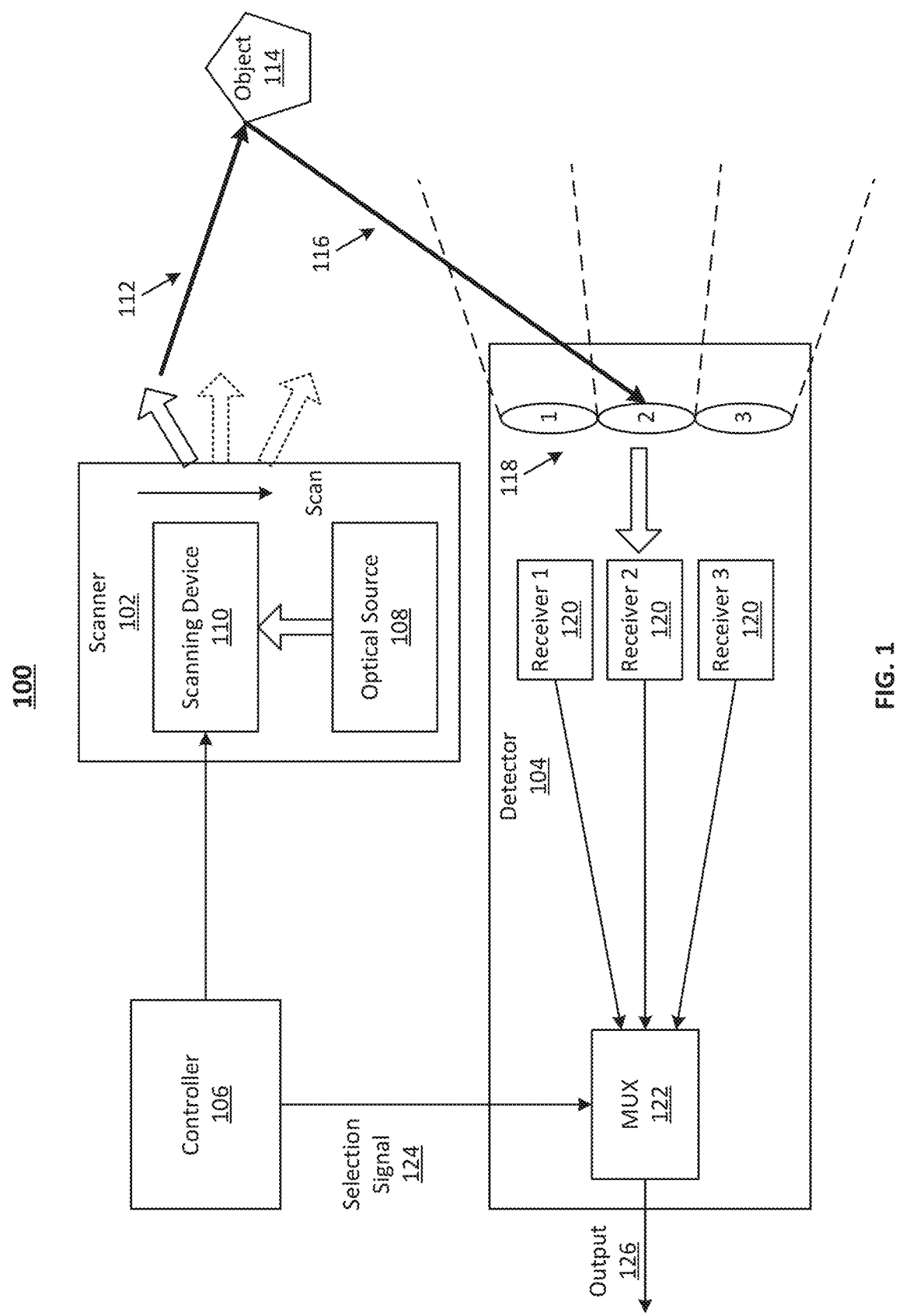
FIG. 1 illustrates a block diagram of an exemplary light detection system using multiple lens-receiver units, according to embodiments of the disclosure.

FIG. 1 illustrates a block diagram of an exemplary light detection system 100 using multiple lens-receiver units 118-120, according to embodiments of the disclosure. System 100 may include a scanner 102, a detector 104, and a controller 106 operatively coupled to scanner 102 and detector 104. Scanner 102 may emit laser beams within a scan angle. Consistent with the disclosures of the present application, the optical gain of system 100 can be increased by including multiple lens-receiver units in detector 104, each having a narrow FOV (e.g., smaller than the scan angle of scanner 102), and controller 106 that can dynamically select, based on the position of scanner 102, one of lens-receiver units 118-120 for return light detection. The increased optical gain of system 100 can cause improved SNR, enable longer detection distance, and achieve better over-ranging performance. It is contemplated that although system 100 will be described as a LiDAR system for ease of description, system 100 is not limited to a LiDAR system and can be any suitable light detection systems that can collect light returned from a target and convert the collected light into electrical signals based on the intensity of the collected light.

As part of a LiDAR system, scanner 102 can emit a stream of laser pulses in different directions within its scan angle. As illustrated in FIG. 1, scanner 102 may include an optical source 108 and a scanning device 110. Optical source 108 may be configured to provide light to scanning device 110. In some embodiments, optical source 108 may be a laser generating pulsed laser light in the ultraviolet, visible, or near infrared wavelength range. Scanning device 110 may be configured to scan the light provided by optical source 108 within a scan angle at a scan rate toward an object 114 in the surrounding scene. Object 114 may have a wide range of materials including, for example, non-metallic objects, rocks, rain, chemical compounds, aerosols, clouds and even single molecules. The wavelength of the laser light may vary to suit object 114, such as 532 nm laser, 600-1000 nm lasers, 1064 nm laser, 1550 nm laser, etc. At each time point during the scan, scanning device 110 may emit light 112 (incident light) to object 114 in a direction (incident direction) within the scan angle. In some embodiments, scanning device 110 may also include optical components (e.g., lenses, mirrors) that can focus pulsed laser light into a narrow laser beater to increase the scan resolution and range of object 114.

As part of a LiDAR system, detector 104 can collect laser pulses returned from object 114 and output electrical signal reflecting the intensity of the returned laser pulses. Upon contact, light can be reflected by object 114 via backscattering, such as Rayleigh scattering, Mie scattering, Raman scattering, and fluorescence. As illustrated in FIG. 1, Detector 104 may include a plurality of lenses 118 and a plurality of receivers 120. Each receiver 120 may correspond to one of lenses 118, for example, arranged behind corresponding lens 118 with a certain distance and detect the optical signal collected by corresponding lens 118. Each pair of corresponding lens 118 and receiver 120 is referred to herein as a "lens-receiver unit." Consistent with the disclosures of the present application, each lens 118 may be configured to collect light from a respective direction and have a narrower FOV compared with the entire FOV of detector 104. In some embodiments, the FOV of each lens 118 may be smaller than the scan angle of scanner 102, e.g., a fraction of the scan angle. That is, the FOV of each lens 118 may be a segment of the full FOV of detector 104. The combined FOVs of all lenses 118 may be the same as or larger than the scan angle to ensure the collection of light 116 returned from object 114 (returned light). At each time point during the scan, returned light 116 may be collected by only one of plurality of lenses 118 (e.g., lens 2 in the example shown in FIG. 1) depending on the direction of returned light 116, which is determined by the incident direction of incident light 112.

Each receiver 120 may be configured to convert the light (e.g., returned light 116) collected by corresponding lens 118 into an electrical signal (a current or a voltage signal). In some embodiments, each receiver 120 may include a photodiode, such as an avalanche photodiode (APD), which is a semiconductor device that converts light into an electrical current. The current is generated when photons are absorbed in the photodiode. Materials that can be used to produce photodiodes include Si, Ge, InGaAs, etc. It is contemplated that receiver 120 is not limited to a photodiode and can be any suitable solid-state photodetector or a photomultiplier that can convert a light signal into an electrical signal indicative of the intensity of the light, such as a phototransistor. In the example shown in FIG. 1, at a certain time point during the scan, receiver 2 corresponding to lens 2 receives the optical signal with full intensity from returned light 116 collected by lens 2 and convert the optical signal into an electrical signal. The optical gain of receiver 2 can be increased due to the smaller distance between receiver 2 and lens 2 caused by the smaller FOV of lens 2.

Although in FIG. 1, one receiver 120 corresponds to one lens 118, it is understood that in some embodiments, more than one receiver 120 may correspond to one lens 118 and together convert the optical signal of corresponding lens 118 into an electrical signal. That is, a lens-receiver unit disclosed herein may include one lens 118 and at least one corresponding receiver 120.

The multiple lens-receiver units in detector 104 may be arranged in any suitable manner as to yield a sufficiently small FOV for each lens. In some embodiments, the FOVs may be designed to be smaller than 20 degrees, smaller than 10 degrees, or smaller than 5 degrees, depending on the arrangements and applications. For example, the multiple lens-receiver units may be arranged in a one-dimensional or a two-dimensional array. Smaller individual receiver FOVs correspond to higher SNRs in the received signals.

Figure 3A:
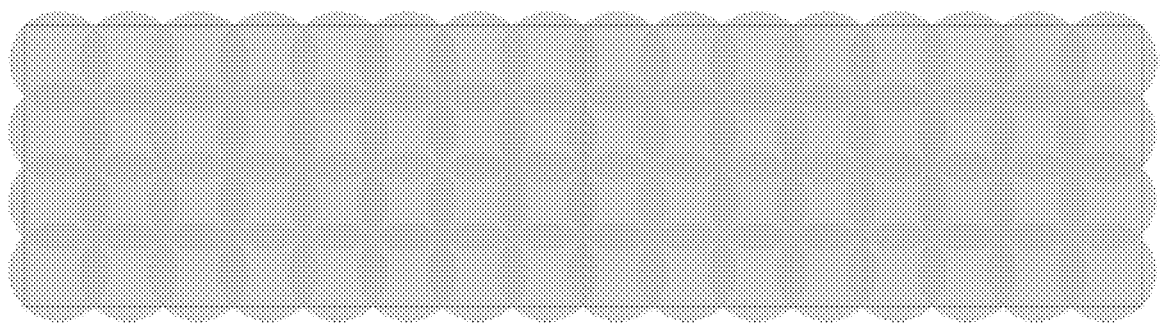
FIGS. 3A-3B illustrate exemplary arrays of lens-receiver units, according to embodiments of the disclosure.
Figure 3B:
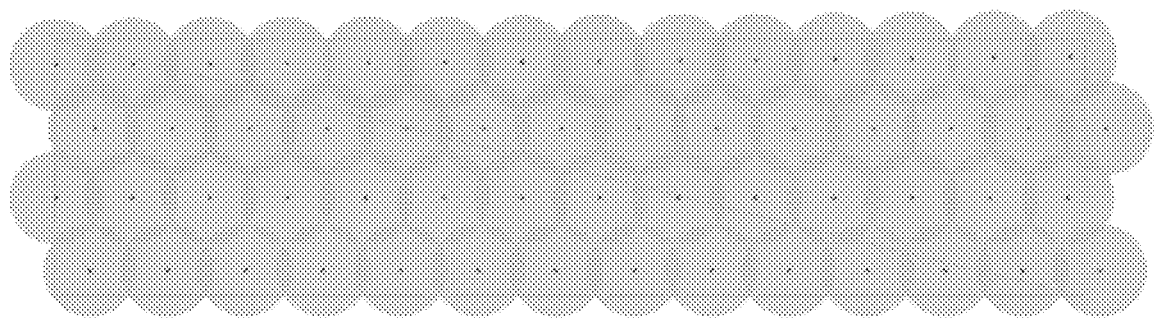

FIGS. 3A-3B illustrate exemplary arrays of lens-receiver units, according to embodiments of the disclosure. FIG. 3A illustrates an orthogonal arrangement of an array of 64 lens-receiver units in four rows and 16 columns. The lens-receiver units are aligned in both the row direction and column direction and have the same shape and dimension. In this example, lens of each lens-receiver unit has a FOV of 6.18 degrees (half angle), so the combined FOV of the array of lenses within the rectangle in FIG. 3A is 35 degrees by 125 degrees.

FIG. 3B illustrates a hexagonal arrangement of an array of 48 lens-receiver units in four rows and 12 columns (in a "delta" arrange with offset between adjacent rows). The lens-receiver units are aligned in the row direction, but not in the column direction, and have the same shape and dimension. In this example, lens of each lens-receiver unit has a FOV of 6.36 degrees (half angle), so the combined FOV of the array of lenses within the rectangle in FIG. 3A is also 35 degrees by 125 degrees. That is, to achieve a combined FOV as set by the scan angle to ensure the collection of the returned light, the array of lens-receiver units may be arranged in various manners. The arrangements shown in FIGS. 3A and 3B are only exemplary, and other arrangements may be used based on the scan angle (the same as the combined FOV) and the shape and/or size of lens, etc. Although each lens-receiver unit is shown as circular in shape in FIGS. 3A-3B, it is contemplated that in some embodiments, the shape can vary, such as square, hexagon, etc.

Figure 4:
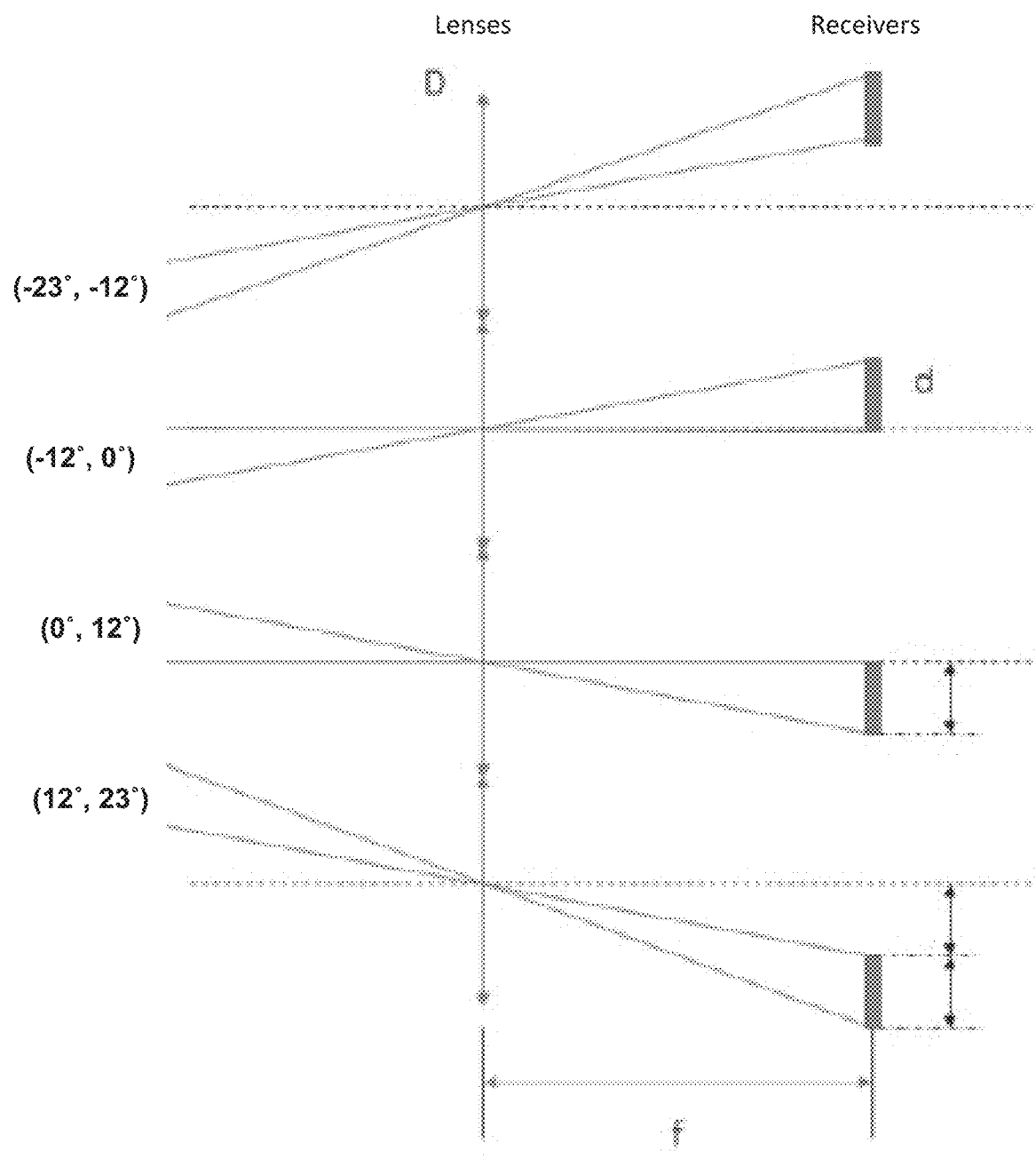
FIG. 4 illustrates a diagram of exemplary optical paths of multiple lens-receiver units, according to embodiments of the disclosure.

FIG. 4 illustrates a diagram of exemplary optical paths of multiple lens-receiver units, according to embodiments of the disclosure. Each receiver has a width d and a distance f from the corresponding lens having a width D. In some embodiments, the distance f may be the same as the focal length of the corresponding lens. The FOV of each lens-receiver unit may be determined based on at least some of the parameters d, D, and f. In the example of FIG. 4, each lens-receiver unit has a FOV of 12 degrees in the vertical direction. [The numbers in each bracket shows the FOV range covered by the corresponding receiver, i.e. (12°, 23°) means 12° to 23°.

Figure 5:
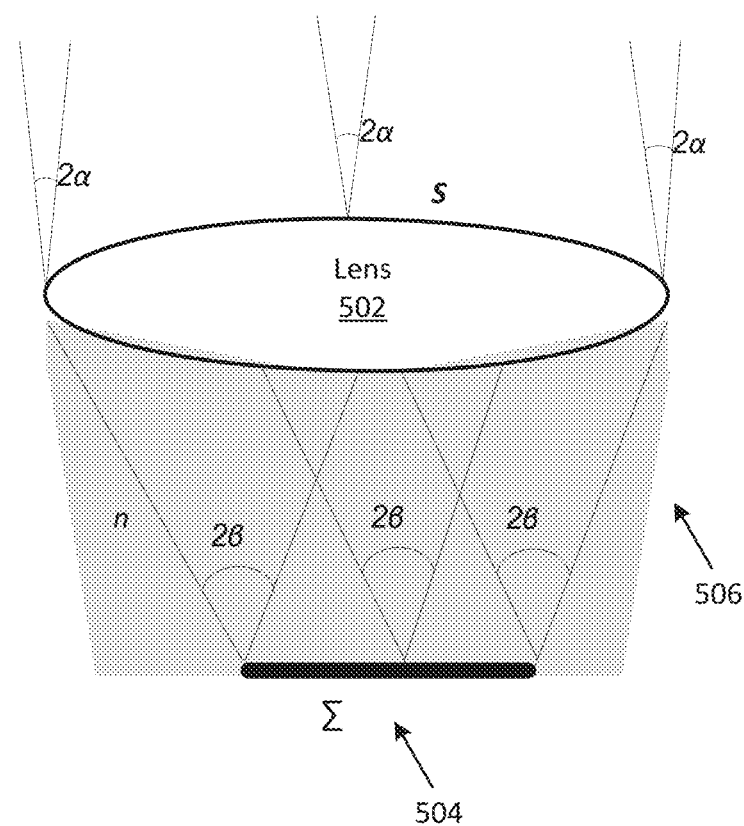
FIG. 5 illustrates a diagram of an exemplary lens-receiver unit, according to embodiments of the disclosure.

FIG. 5 illustrates a diagram of an exemplary lens-receiver unit 500, according to embodiments of the disclosure. Lens-receiver unit 500 includes a lens 502 and a receiver 504. FIG. 5 shows the etendues of the light reaching lens 502 and the light reaching receiver 504. Specifically, the limit on maximum concentration is lens 502 having an entrance aperture S collecting light in the air in which the refractive index is 1 within a solid angle of angle 2α (known as an "acceptance angle") and sending it to a smaller area of receiver Σ504 immersed in a medium of refractive index n, whose points are illuminated within a solid angle of angle 2β. The concentration C of lens 502 (i.e., the receiving limit of lens-receiver unit 500), which characterizes the ability of an optical system to accept light, is calculated by Equation (1) below:

$$C = n^2 \frac{\sin \beta^2}{\sin \alpha^2}. \quad (1)$$

For example, for lens 502 with a FOV of 30 degrees by 30 degrees, when α equals 24.5 degrees, β equals 60 degrees, C equals 2.09; when α equals 5 degrees, β equals 60 degrees, C equals 10.

One way to increase the receiving limit of lens-receiver unit 500 is increasing the refractive index n of the medium in which receiver 504 is immersed. In some embodiments, receiver 504 may include optical glue 506 filled between receiver 504 and lens 502. The refractive index of optical glue 506 may be larger than 1, such as between 1.1 and 1.8. Optical glue 506 thus can be any suitable adhesive that is optically transparent to returned light 116 and having a refractive index larger than 1 to enhance the receiving limit of lens-receiver unit 500. For ease of manufacturing, optical glue 506 may be cured optically when exposed to light in a particular wavelength range, such as ultraviolet or visible light, or to heat.

Referring back to FIG. 1, detector 104 may also include a multiplexer (MUX) 122 operatively coupled to each receiver 120 and controller 106. MUX 122 may be configured to select at least one of multiple receivers 120 to output the corresponding electrical signal as an output 126 of detector 104. During each scan, MUX 122 can switch between the multiple lens-receiver units as the incident direction of incident light 112 changes. The selected receiver(s) corresponds to the lens collecting the returned light. In the example shown in FIG. 1, receiver 2 is the selected receiver corresponding to lens 2 that collects returned light 116 returned from object 114. It is contemplated that MUX 122 may select only one set of receivers of multiple receives 120 at one time, and output 126 corresponds to the electrical signal of only one set receivers of multiple receives 120. The selected set of receivers include one or more receivers corresponding to the lens collecting the returned light. That is, only one of the multiple lens-receiver units (that includes one lens and one or more corresponding receivers) can be selected at one time. In some embodiments, MUX 122 may be configured to receive a selection signal 124 from controller 106 and select the receiver(s) based on selection signal 124. In other words, selection signal 124 from controller 106 is indicative of the selected receiver.

Controller 106 may be configured to control the scanning operation of scanner 102. For example, controller 106 may control the position of scanner 102, which in turn affects the incident direction of the incident light on object 114 in a particular time point during the scan. That is, controller 106 can dynamically control scanner 102 to emit the incident light in an incident direction within the scan angle.

Controller 106 may be further configured to control the detection operation of detector 104. In some embodiments, controller 106 may control MUX 122 to select receiver 120 based on the incident direction of incident light 112. For example, controller 106 may use real-time information related to the position of scanner 102 and/or the direction in which incident light 112 is emitted to object 114 to dynamically determine one of the multiple lens-receiver units in detector 104 in which the lens collects returned light 116.

Figure 2:
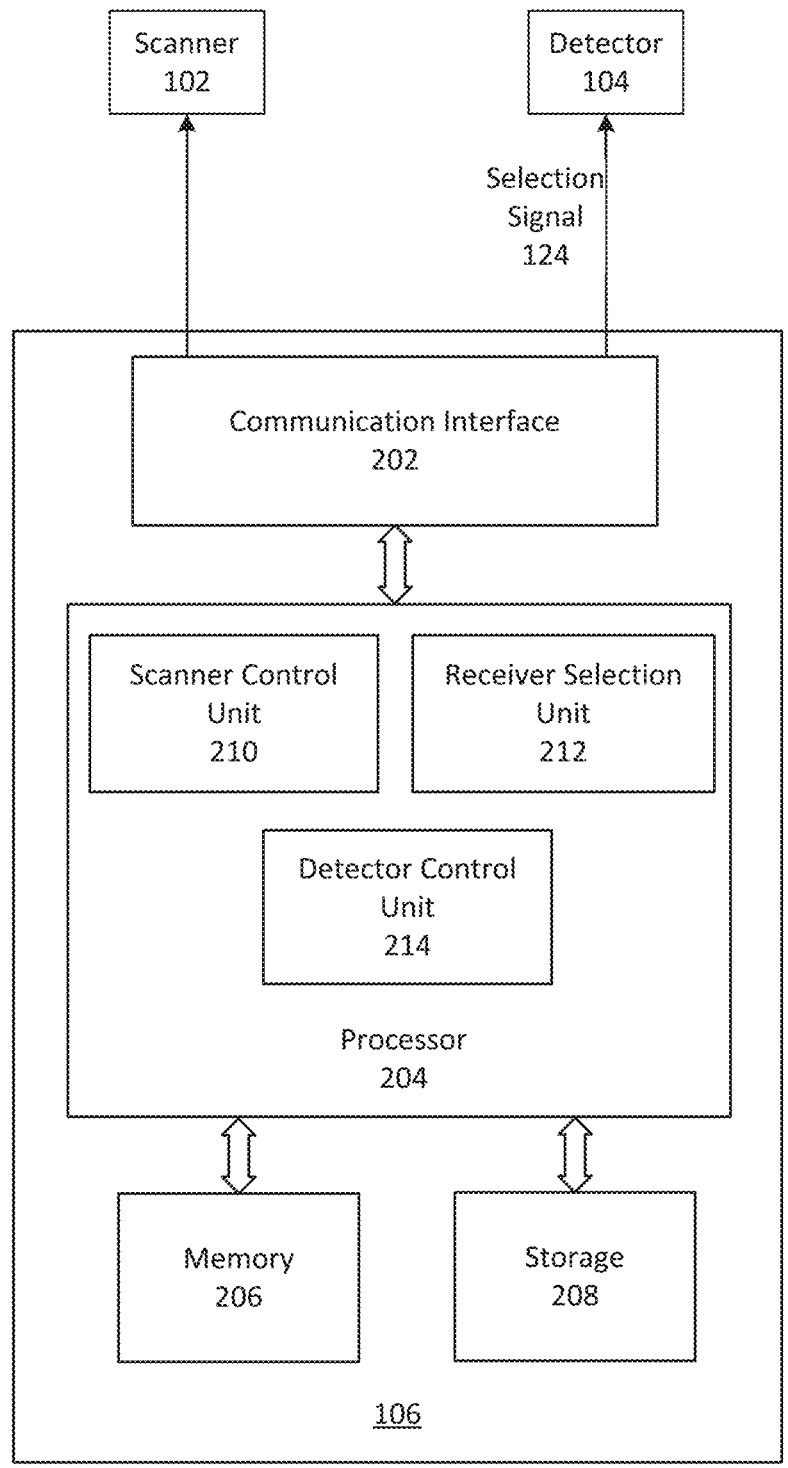
FIG. 2 illustrates a block diagram of an exemplary controller, according to embodiments of the disclosure.

For example, FIG. 2 illustrates a block diagram of an exemplary controller 106, according to embodiments of the disclosure. Consistent with the present disclosure, controller 106 may control MUX 122 to select at least one of receivers 120 based on the incident direction of incident light 112. Controller 106 may send selection signal 124 to detector 104 indicative of the selected receiver(s). In some embodiments, controller 106 may also send control signals to scanner 102, for example, indicative of the position, scan angle, scan rate, or any other suitable operation parameters of scanner 102.

In some embodiments, as shown in FIG. 2, controller 106 may include a communication interface 202, a processor 204, a memory 206, and a storage 208. In some embodiments, controller 106 may have different modules in a single device, such as an integrated circuit (IC) chip (implemented as an application-specific integrated circuit (ASIC) or a field-programmable gate array (FPGA), or separate devices with dedicated functions. In some embodiments, one or more components of controller 106 may be located along with scanner 102 and/or detector 104 or may be alternatively in a standalone computing device, in the cloud, or another remote location. Components of controller 106 may be in an integrated device, or distributed at different locations but communicate with each other through a network (not shown). For example, processor 204 may be a processor on-board scanner 102 and/or detector 104, a processor inside a standalone computing, or a cloud processor, or any combinations thereof.

Communication interface 202 may send data to and receive data from components such as scanner 102 and detector 104 via communication cables, a Wireless Local Area Network (WLAN), a Wide Area Network (WAN), wireless networks such as radio waves, a nationwide cellular network, and/or a local wireless network (e.g., Bluetooth™ or WiFi), or other communication methods. In some embodiments, communication interface 202 can be an integrated services digital network (ISDN) card, cable modem, satellite modem, or a modem to provide a data communication connection. As another example, communication interface 202 can be a local area network (LAN) card to provide a data communication connection to a compatible LAN. Wireless links can also be implemented by communication interface 202. In such an implementation, communication interface 202 can send and receive electrical, electromagnetic or optical signals that carry digital data streams representing various types of information via a network.

Processor 204 may include any appropriate type of general-purpose or special-purpose microprocessor, digital signal processor, or microcontroller. Processor 204 may be configured as a separate processor module dedicated to controlling scanner 102 and detector 104. Alternatively, processor 204 may be configured as a shared processor module for performing other functions unrelated to controlling scanner 102 and detector 104.

As shown in FIG. 2, processor 204 may include multiple modules, such as a scanner control unit 210, a receiver selection unit 212, a detector control unit 214, and the like. These modules (and any corresponding sub-modules or sub-units) can be hardware units (e.g., portions of an integrated circuit) of processor 204 designed for use with other components or to execute a part of a program. The program may be stored on a computer-readable medium, and when executed by processor 204, it may perform one or more functions. Although FIG. 2 shows units 210-214 all within one processor 204, it is contemplated that these units may be distributed among multiple processors located near or remotely with each other.

Scanner control unit 210 may be configured to control the operations of scanner 102, such as but not limited to, the position of scanner 102, the scan angle of scanner 102, the scan rate of scanner 102, etc. By controlling the position, scan angle, scan rate, and/or any other operation parameters, scanner control unit 210 can determine the incident angle of incident light 112 at each time point during the scan.

Receiver selection unit 212 may be configured to determine one of lenses 118 in detector 104 that collects returned light 116 at the respective time point based on the incident angle of incident light 112 at the time point. Thus, receiver selection unit 212 can also identify the corresponding at least one receiver of the determined lens from multiple receivers 120 in detector 104. In one example, a lookup table may be created to map each incident direction within the scan angle to one of the lens-receiver units in detector 104. In one example, the lookup table may be pre-installed in controller 106 and retrieved by receiver selection unit 212. In another example, the lookup table may be stored and updated in a remote location and retrieved by controller 106 via communication interface 202 as needed. Controller 106 may determine the selected receiver(s) based on the incident direction using the lookup table. It is contemplated that receiver selection unit 212 of controller 106 may use any other suitable approach to dynamically determine the selected receiver based on the incident direction of incident light 112.

Detector control unit 214 may be configured to provide selection signal 124 indicative of the selected receiver(s) to MUX 122 of detector 104. The frequency in which selection signal 124 is updated and provided by detector control unit 214 may depend on the scan rate of scanner 102.

Memory 206 and storage 208 may include any appropriate type of mass storage provided to store any type of information that processor 204 may need to operate. Memory 206 and storage 208 may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 206 and/or storage 208 may be configured to store one or more computer programs that may be executed by processor 204 to perform scanner 102 and detector 104 control functions disclosed herein. For example, memory 206 and/or storage 208 may be configured to store program(s) that may be executed by processor 204 to control operations of scanner 102 and detector 104, and process the data to generate selection signal 124 and any other control signals.

Memory 206 and/or storage 208 may be further configured to store information and data used by processor 204. For instance, memory 206 and/or storage 208 may be configured to store the lookup table for determining the selected receiver and the generated selection signal 124. The various types of data may be stored permanently, removed periodically, or disregarded immediately after each scan.

Figure 6:
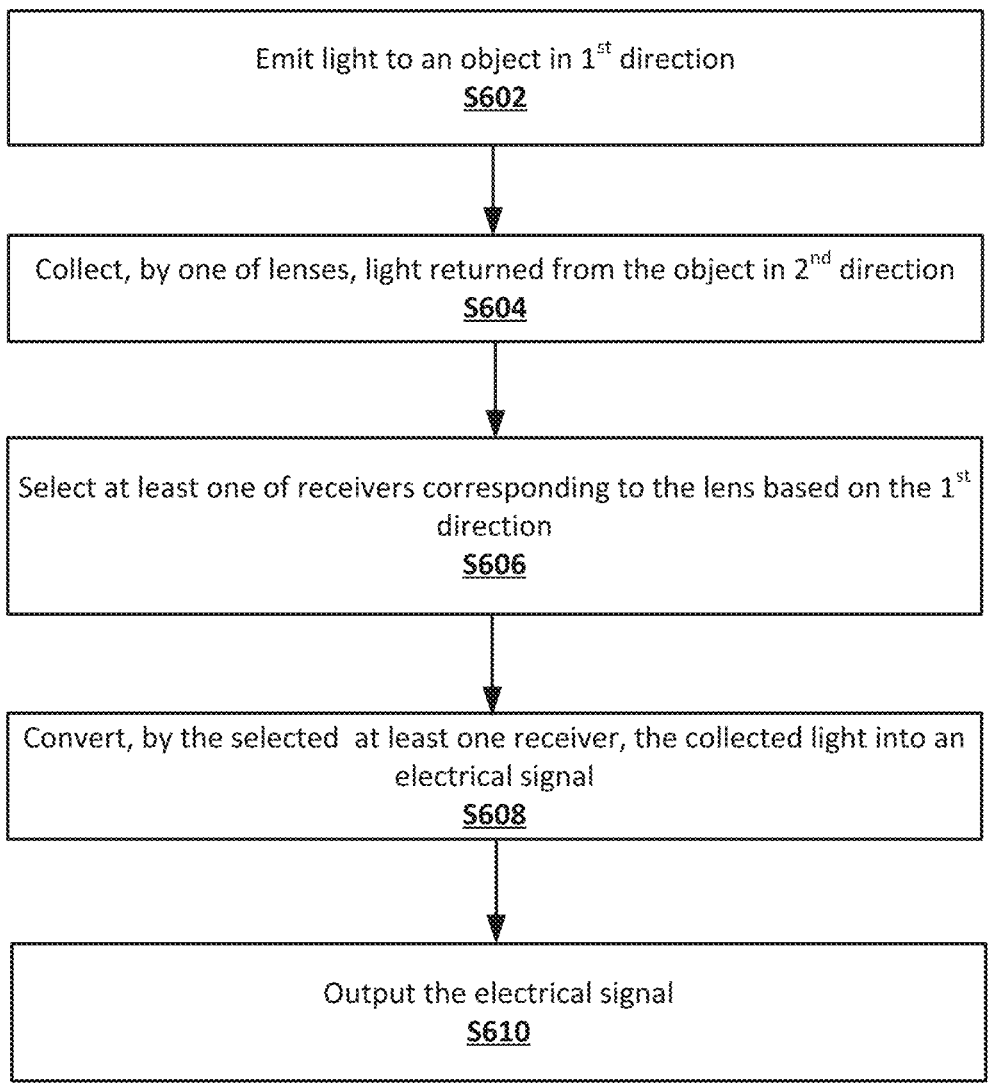
FIG. 6 illustrates a flowchart of an exemplary method for detecting light returned from an object, according to embodiments of the disclosure.

FIG. 6 illustrates a flowchart of an exemplary method 600 for detecting light returned from an object, according to embodiments of the disclosure. For example, method 600 may be implemented by light detection system 100 in FIG. 1. However, method 600 is not limited to that exemplary embodiment. Method 600 may include steps S602-S610 as described below. It is to be appreciated that some of the steps may be optional to perform the disclosure provided herein. Further, some of the steps may be performed simultaneously, or in a different order than shown in FIG. 6.

In step S602, light is emitted, by scanner 102, to an object in a first direction. The object may be any target in the surrounding scene of scanner 102. The light may be a pulsed laser beam in the ultraviolet, visible, or near infrared wavelength range. In some embodiments, light may be scanned within scan angle at a scan rate as scanner 102 moves, and the first direction may be determined based on the position of scanner 102.

In step S604, light returned from the object in a second direction may be collected by one of a plurality of lenses 118 in detector 104. The plurality of lenses 118 may be arranged in an array, and each lens 118 may be configured to collect light in a second direction corresponding to the first direction. The FOV of each lens 118 may be smaller than the scan angle of scanner 102. In some embodiments, the FOV of each lens 118 may be a segment of a full FOV of a single lens used for collecting the returned light. In some embodiments, only one of lenses 118 can receive the returned light at each time during the scan.

In step S606, at least one of a plurality of receivers 120 that corresponds to the lens collecting the returned light is selected by MUX 122. Selection of MUX 122 is controlled by a selection signal 124 provided by controller 106. In some embodiments, selection signal 124 may be determined according to the first direction and a lookup table stored in controller 106. Each receiver 120 may include a photodiode or any other suitable device for converting a light signal into an electrical signal. In some embodiments, each receiver 120 may also include optical glue filled between receiver 120 and corresponding lens 118 to enhance the receiving limit of receiver 120. Each receiver 120 can convert the light collected by the corresponding lens into an electrical signal, but only the receiver(s) corresponding to the lens that is collecting the returned light can be selected by MUX 122 at each time during the scan. In some embodiments, the selected receiver(s) may be determined, by controller 106, among the plurality of receivers 120 based on the first direction in which the incident light is emitted. Controller 106 may control the first direction of the incident light, for example, by controlling the position of scanner 102, and then use the first direction to determine the lens that collects the returned light in the second direction. The selected receiver(s) correspond to the lens. A selection signal may be provided, by controller 106, to indicate the selected receiver.

In step S608, the collected light is converted, by the selected receiver(s), into an electrical signal, such as a current signal or a voltage signal. In some embodiments, only the selected receiver(s) can make the conversion at each time point during the scan as the returned light is collected by only the corresponding lens. In step S610, the converted electrical signal is outputted from detector 104.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. An apparatus for detecting light returned from an object in a Light Detection and Ranging (LiDAR) system, comprising:
    a plurality of lenses, each configured to collect light returned from the object in a respective direction;
    a plurality of receivers, each one of the plurality of receivers corresponding to one of the plurality of lenses and configured to convert the light collected by the corresponding lens into an electrical signal; and
    a multiplexer operatively coupled to the plurality of receivers and configured to:
        receive a selection signal provided based on a direction in which light is emitted to the object causing the returned light; and
        select at least one of the plurality of receivers to output the corresponding electrical signal based on the selection signal, wherein the selected at least one receiver corresponds to the lens collecting the light returned from the object,
    wherein the plurality of lenses and the plurality of receivers are in a hexagonal arrangement.

2. The apparatus of claim 1, wherein a field of view (FOV) for each lens is less than a scan angle in which light can emit to the object causing the light returned from the object.

3. The apparatus of claim 1, wherein the light is a laser light.

4. The apparatus of claim 1, wherein each receiver includes a photodiode.

5. The apparatus of claim 1, wherein each receiver includes optical glue filled between the receiver and the corresponding lens.

6. The apparatus of claim 1, wherein the plurality of lenses and the plurality of receivers are aligned in the row direction, but not in the column direction, and have the same shape and dimension.

7. A system for detecting light returned from an object, comprising:
    a scanner configured to emit light to the object in a first direction within a scan angle;
    a detector configured to detect the light returned from the object in a second direction, comprising:
        a plurality of lenses, each configured to collect light from a respective direction;
        a plurality of receivers, at least one of the plurality of receivers corresponding to one of the plurality of lenses and configured to convert the light collected by the corresponding lens into an electrical signal; and
        a multiplexer operatively coupled to the plurality of receivers and configured to select at least one of the plurality of receivers to output the corresponding electrical signal; and
    a controller operatively coupled to the scanner and detector and configured to:
        control the scanner to emit the light in the first direction;
        determine the at least one receiver among the plurality of receivers based on the first direction;
        provide, to the multiplexer, a selection signal indicative of the determined at least one receiver; and
        control the multiplexer to select the at least one receiver based on the selection signal,
    wherein the plurality of lenses and the plurality of receivers are in a hexagonal arrangement.

8. The system of claim 7, wherein a FOV for each lens is less than the scan angle.

9. The system of claim 7, wherein the light is a laser light.

10. The system of claim 7, wherein each receiver includes a photodiode.

11. The system of claim 7, wherein each receiver includes optical glue filled between the receiver and the corresponding lens.

12. A method for detecting light returned from an object, comprising:
    emitting light to the object in a first direction within a scan angle;
    collecting, by one of a plurality of lenses, the light returned from the object in a second direction;
    determining at least one receiver among the plurality of receivers based on the first direction using a look-up table that maps each incident direction to one of the plurality of receivers, wherein the look-up table is stored and updated in a remote location;
    providing a selection signal indicative of the determined at least one receiver;
    selecting the determined at least one receiver based on the selection signal;
    converting, by the selected receiver, the collected light into an electrical signal; and
    outputting the electrical signal.

13. The method of claim 12, wherein a FOV for each lens is less than the scan angle.

14. The method of claim 12, wherein the light is a laser light.

15. The method of claim 12, wherein each receiver includes a photodiode.

16. The method of claim 12, wherein the plurality of lenses are arranged in an array.

* * * * *